United States Patent
Tsujimura et al.

(10) Patent No.: US 7,221,089 B2
(45) Date of Patent: May 22, 2007

(54) ORGANIC LIGHT EMITTING DIODE DISPLAY DEVICE AND METHOD OF MANUFACTURING THE SAME

(75) Inventors: Takatoshi Tsujimura, Shiga (JP); Mitsuo Morooka, Shiga (JP); Kuniaki Sueoka, Kanagawa (JP); Sayuri Kohara, Shiga (JP)

(73) Assignees: Chi Mei Optoelectronics Corp., Tainan Hsien (TW); Kyocera Corporation, Kyoto (JP)

( * ) Notice: Subject to any disclaimer, the term of this patent is extended or adjusted under 35 U.S.C. 154(b) by 160 days.

(21) Appl. No.: 10/652,549

(22) Filed: Sep. 2, 2003

(65) Prior Publication Data

US 2005/0258745 A1 Nov. 24, 2005

(30) Foreign Application Priority Data

Sep. 3, 2002 (JP) .............................. 2002-258138

(51) Int. Cl.
*H05B 33/00* (2006.01)
(52) U.S. Cl. ..................... 313/504; 313/506; 313/512
(58) Field of Classification Search ................ 313/506, 313/507, 509
See application file for complete search history.

(56) References Cited

U.S. PATENT DOCUMENTS 6,246,179 B1 * 6/2001 Yamada .................. 315/169.3
6,359,606 B1 * 3/2002 Yudasaka ..................... 345/87
6,369,495 B2 * 4/2002 Codama et al. ............. 313/292
6,388,377 B1 * 5/2002 Kobayashi et al. ......... 313/505
6,429,584 B2 * 8/2002 Kubota ........................ 313/504
6,798,132 B2 * 9/2004 Satake ........................ 313/495
6,872,473 B2 * 3/2005 Song et al. ................. 428/690
2001/0031379 A1* 10/2001 Tera et al. .................. 428/690

OTHER PUBLICATIONS

T. Sasaoka, et al., "Late-News Paper: A 13.0-inch AM-OLED Display with Top Emitting Structure and Adaptive Current Mode Programmed Pixel Circuit (TAC)", SID Tech. Digest, 2001, pp. 384-387.

* cited by examiner

*Primary Examiner*—Ashok Patel
(74) *Attorney, Agent, or Firm*—Birch, Stewart, Kolasch & Birch, LLP

(57) ABSTRACT

An organic light emitting diode display device includes a plurality of organic light emitting diode elements that are arranged in a matrix; a plurality of protective layers, each of the protective layers covering at least one of the organic light emitting diode elements; and a stress relaxation layer that is formed between the protective layers, for relaxing a stress caused by the protective layers. The stress relaxation layer may surround the protective layer. Moreover, the stress relaxation layer may be made of a shading material, and serve as a mask for forming the organic light emitting diode elements.

18 Claims, 8 Drawing Sheets

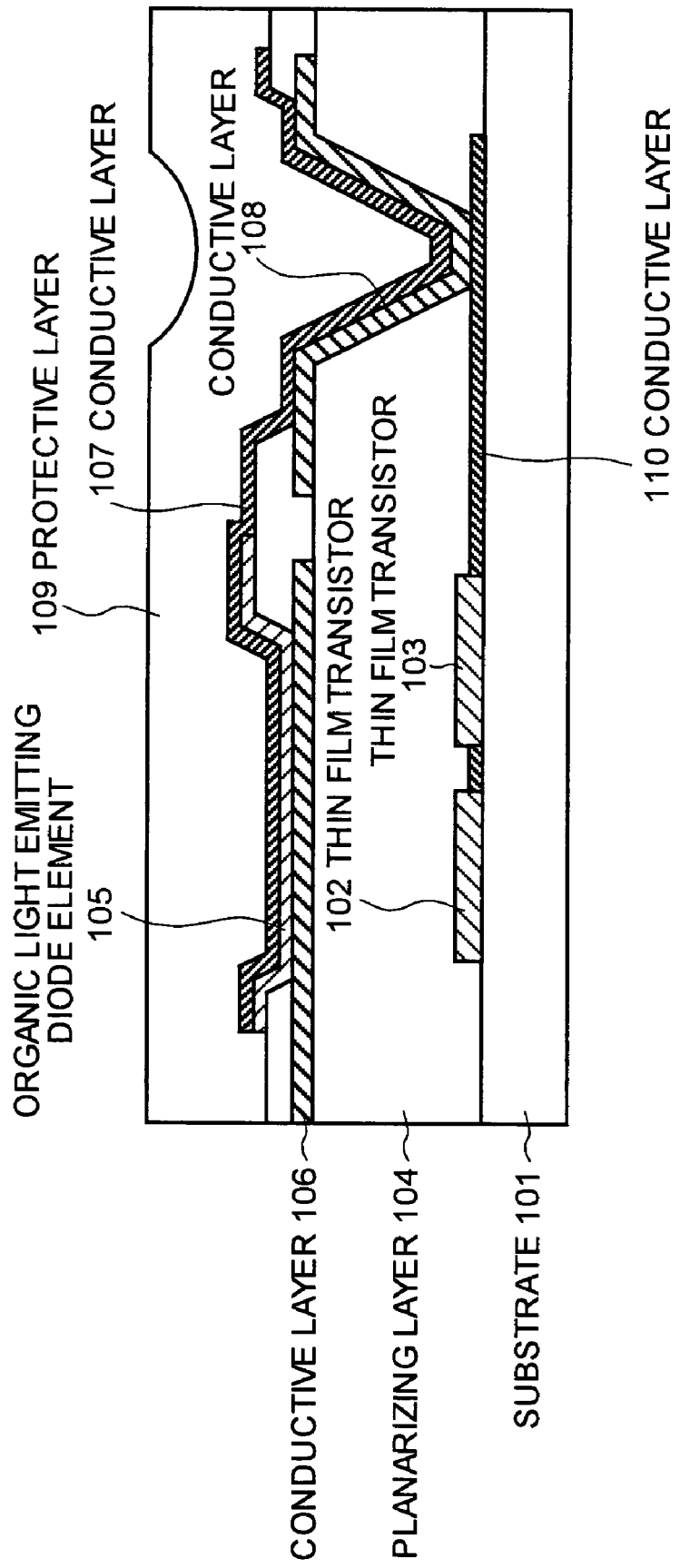

ORGANIC LIGHT EMITTING DIODE DISPLAY DEVICE AND METHOD OF MANUFACTURING THE SAME

BACKGROUND OF THE INVENTION

1) Field of the Invention

The present invention relates to an organic light emitting diode display device including organic light emitting diode elements as light emission elements, and each of the organic light emitting diode elements is covered with a protective layer. More specifically, the present invention relates to the organic light emitting diode display device having a stress relaxation layer for relaxing a stress caused by the protective layer, and a method of manufacturing the organic light emitting diode display device.

2) Description of the Related Art

Organic light emitting diode displays are now attracting attention as candidates for flat display devices instead of liquid crystal displays. The organic light emitting diode displays differ from the liquid crystal displays in that organic light emitting diode elements generating light are employed. In other words, the organic light emitting diode displays do not require backlight which the liquid crystal displays need. An organic light emitting diode element has high speed response, high contrast, and high visibility. Further, an organic light emitting diode display using the organic light emitting diode element has a relatively simple structure, which is advantageous in view of manufacturing cost.

FIG. 8 is a sectional view of a display cell of a conventional organic light emitting diode display. A thin film transistor 102 serving as a switching element, a thin film transistor 103 serving as a driver element, and a conductive layer 110 are formed on a substrate 101. A planarizing layer 104 is formed to cover the substrate 101, and the thin film transistors 102 and 103. An organic light emitting diode element 105, and conductive layers 106 and 107 are formed on the planarizing layer 104 so that the organic light emitting diode element 105 is located between the conductive layers 106 and 107. The conductive layer 107 is electrically connected to the thin film transistor 103 via conductive layers 108 and 110. The organic light emitting diode element 105 is electrically connected to and controlled by the thin film transistors 102 and 103. A protective layer 109 is deposited on the uppermost layer as shown FIG. 8. Such a protective layer is disclosed in, for example, "A 13.0-inch AM-OLED display with top emitting structure and adaptive current mode programmed pixel circuit", T. Sasaoka et al, SID Tech. Dig., 2001, pp. 384 to 387.

The organic light emitting diode element 105 has a structure similar to that of a light emitting diode, including at least one of a hole transport layer and an electron transport layer, and an emitting layer. These hole transport layer, the electron transport layer, and the emitting layer are made of organic materials such as diamine compounds, quinolinol aluminum complex, and phthalocyanine. Some carbon-carbon conjugated bonds of these materials are easily separated by moisture or oxygen. Separating of the carbon-carbon conjugated bonds causes electrical conductivity to decrease. Therefore, the organic light emitting diode display has a sealing structure for protecting the surface of the organic light emitting diode elements from air.

To date, for such a sealing structure, the organic light emitting diode display is protected from air with a glass substrate separated from the surface of the organic light emitting diode elements by spacers. However, the glass substrate causes various problems such as occurrence of optical loss. For example, light emitted from the organic light emitting diode element is reflected by the glass surface, and weight and thickness of the organic light emitting diode display increases in addition to an increase in the cost of the glass substrate. Therefore, using the protective layer 109 made of silicon nitride (hereinafter, "$SiN_x$") having excellent light transmission characteristics, instead of the glass substrate, is desired.

However, the protective layer has a problem in which the protective layer located on the surface of the organic light emitting diode display causes a tensile stress. The tensile stress causes separation of the protective layer or substrate crack.

The material of the organic light emitting diode element is weak against a high temperature, and the glass transition occurs at a temperature as low as about 120 degrees centigrade. Therefore, depositing the protective layer requires the temperature condition not higher than the glass-transition temperature, more specifically, from about 80 to about 120 degrees centigrade.

Generally, it is common to deposit $SiN_x$ at a temperature of from 250 to 300 degrees centigrade, and preferably about 280 degrees centigrade. The $SiN_x$ layer deposited under a temperature of from about 80 to about 120 degrees centigrade has a lower density. The lower density leads to strong interatomic force. As a result, an influence of stress to the organic light emitting diode elements increases as compared with the normal layer structure.

Further, in order to protect the organic light emitting diode elements from air sufficiently, the protective layer needs to have a certain thickness, specifically, a thickness of from 1 to 3 micrometers. Generally, since the stress increases with an increase in the layer thickness, the tensile stress on the surface of the organic light emitting diode elements becomes a serious problem.

The protective layer, not limited to the $SiN_x$ layer, potentially has the problem of the stress. Therefore, in the general organic light emitting diode display which has the sealing structure with the protective layer, it is desired to decrease the stress caused by the protective layer.

SUMMARY OF THE INVENTION

It is an object of the present invention to at least solve the problems in the conventional technology.

The organic light emitting diode display device according to one aspect of the present invention includes an organic light emitting diode element; a protective layer covering the organic light emitting diode element; and a stress relaxation layer adjacent to sides of the protective layer, for relaxing a stress caused by the protective layer.

The organic light emitting diode display device according to another aspect of the present invention includes a plurality of organic light emitting diode elements that are arranged in a matrix; a plurality of protective layers, each of the protective layers covering at least one of the organic light emitting diode elements; and a stress relaxation layer that is formed between the protective layers, for relaxing a stress caused by the protective layers.

The method of manufacturing an organic light emitting diode display device according to still another aspect of the present invention includes forming on a substrate thin film transistors for driving an organic light emitting diode element; forming an insulating layer to cover the thin film transistors; forming a stress relaxation layer to surround area where a protective layer is formed, for relaxing a stress caused by the protective layer; forming an organic light emitting diode element on a part of the area; and forming the protective layer on the area to cover the organic light emitting diode element.

The other objects, features and advantages of the present invention are specifically set forth in or will become apparent from the following detailed descriptions of the invention when read in conjunction with the accompanying drawings.

BRIEF DESCRIPTION OF THE DRAWINGS

FIG. 8 is a sectional view of a display cell of a conventional organic light emitting diode display.

DETAILED DESCRIPTION

Figure 1:
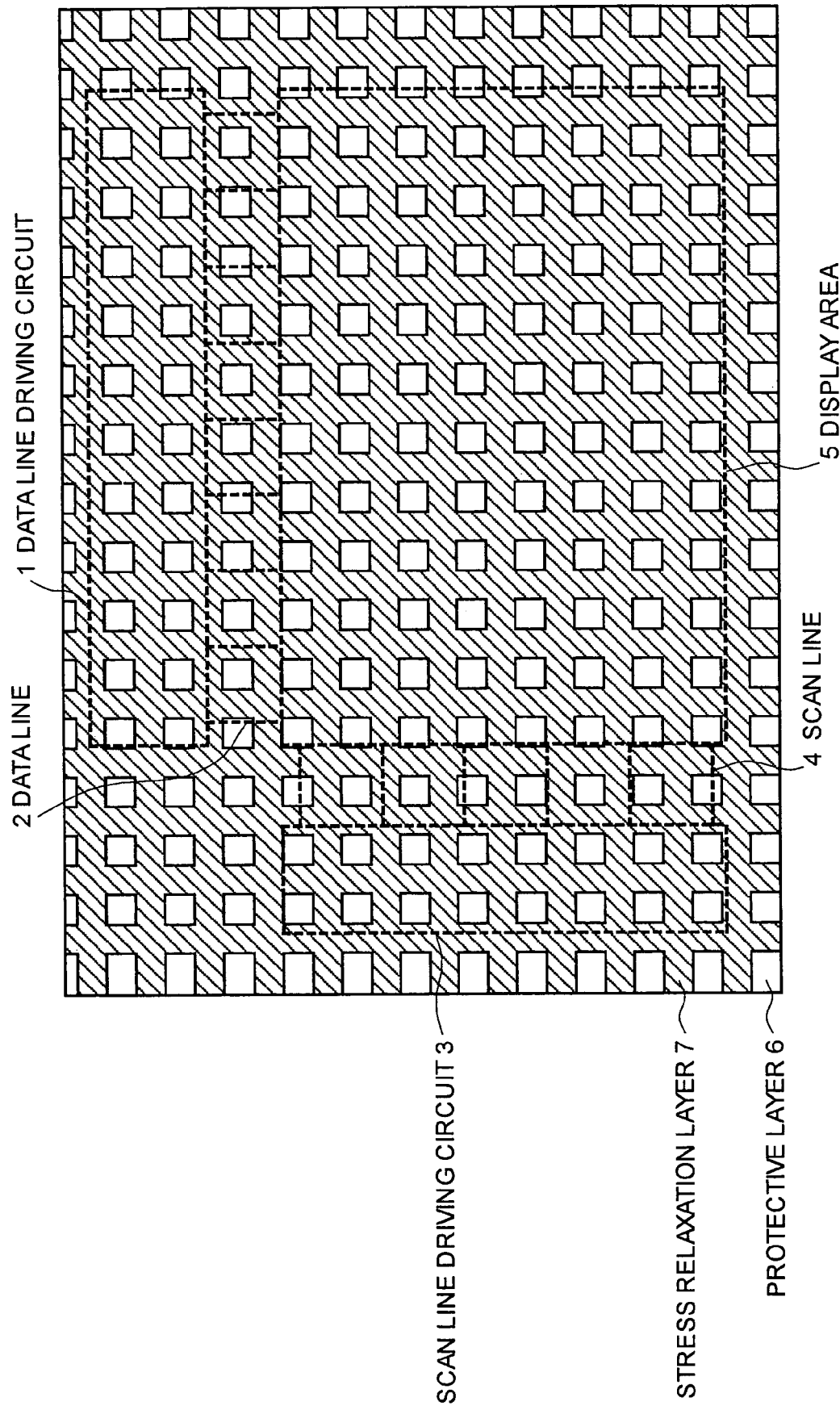
FIG. 1 is a top view of an organic light emitting diode display device according to one embodiment.

The organic light emitting diode display, as the embodiment of the present invention, will be explained with reference to the drawings. In the drawings, the like or similar parts are denoted by the like or similar numerals and names. It should be noted that the drawings are chart-wise, and may be different from actual products. Needless to say, in the drawings, portions having different relations and ratios in relative sizes are included. Further, since it is not necessary to discriminate a source electrode from a drain electrode with respect to the electrodes constituting the thin film transistor, two electrodes excluding a gate electrode are referred to as source and drain electrodes.

The organic light emitting diode display device according to the embodiment uses an organic light emitting diode element as a light emission element, and has a structure in which the protective layer for protecting the organic light emitting diode element from air is divided by a layer structure made of a material different from that of the protective layer and serving as a stress relaxation layer.

FIG. 1 is a top view of the structure of an organic light emitting diode display device according to one embodiment. As shown in FIG. 1, the organic light emitting diode display device according to the embodiment includes a data line driving circuit 1 arranged on an array substrate or within the array substrate, a plurality of data lines 2 extended from the data line driving circuit 1, a scan line driving circuit 3, a plurality of scan lines 4 extended from the scan line driving circuit 3, and a display area 5 in which the organic light emitting diode elements are arranged in a matrix on the array substrate corresponding to pixels. Further, a protective layer 6 for protecting the organic light emitting diode element from air, and a stress relaxation layer 7 arranged to divide the protective layer 6 into a plurality of areas are provided on the array substrate.

The data line driving circuit 1 is for supplying a display signal to the display area 5 via the data line 2. The scan line driving circuit 3 is for supplying a scan signal to the display area 5 via the scan line 4.

The display area 5 is for displaying images based on the supplied display signal and scan signal. Specifically, the display area 5 has the organic light emitting diode elements arranged corresponding to pixels and predetermined circuit elements arranged corresponding to the organic light emitting diode elements, and the circuit elements control predetermined electric current based on the display signal and the scan signal to control the emitting state of the organic light emitting diode elements, thereby displaying an image as a whole.

Figure 2:
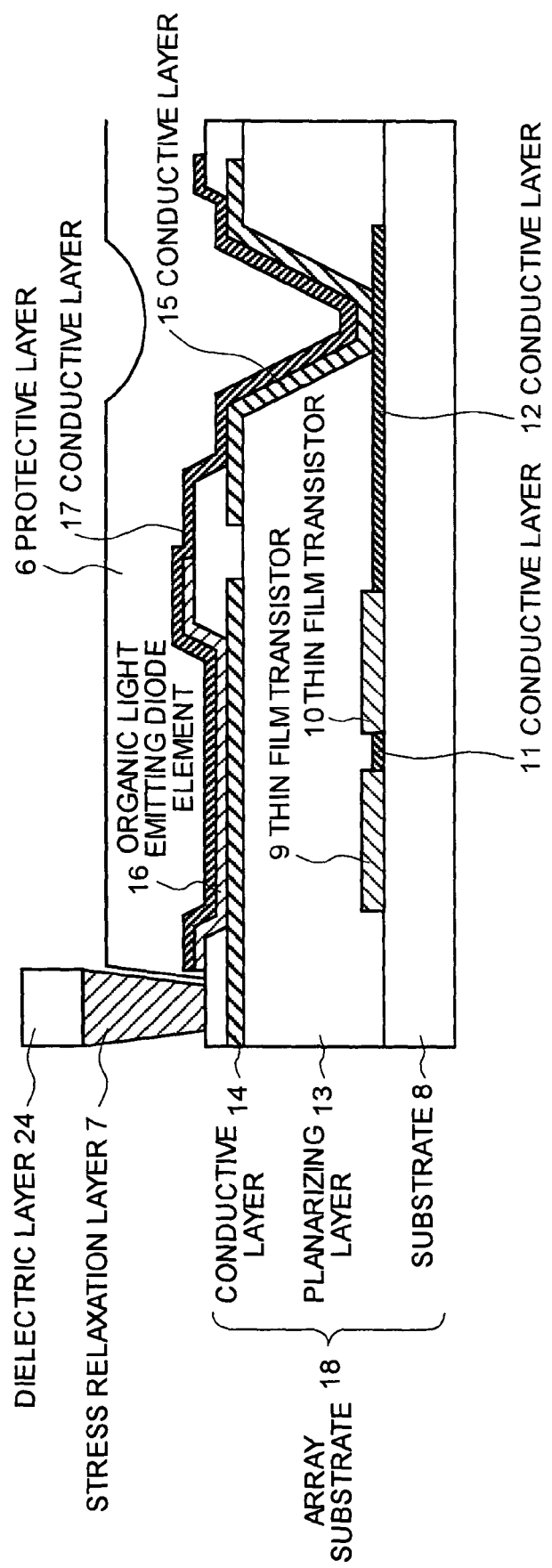
FIG. 2 is a sectional view of a display cell of the organic light emitting diode display device.

The specific structure of the organic light emitting diode display device according to the embodiment will be explained. FIG. 2 is a sectional view of the structure in the display area 5 of the organic light emitting diode display. In the organic light emitting diode display device, thin film transistors 9 and 10 are arranged on a substrate 8, and a conductive layer 11 for contacting the thin film transistors 9 and 10, and a conductive layer 12 for contacting the thin film transistors 9 and 10 with the organic light emitting diode element 16 are arranged thereon. A planarizing layer 13 made of a polymer or the like is laminated on the surface of the substrate 8, and on the thin film transistors 9 and 10, and the conductive layers 11 and 12, excluding a part of the area on the conductive layer 12. Further, a conductive layer 14 extended from a power line is arranged on the planarizing layer 13, and the organic light emitting diode element 16 is arranged on a part of the area of the conductive layer 14. A conductive layer 17 is arranged on the organic light emitting diode element 16, and the conductive layer 17 has a structure of extending horizontally from the organic light emitting diode element 16, and being contacted to the conductive layer 12 via the conductive layer 15.

The thin film transistors 9 and 10 function as a switching element and a driver element, respectively, with respect to the organic light emitting diode element 16. Specifically, the thin film transistor 9 is connected to predetermined data line and scan line, to control the emitting state of the organic light emitting diode element 16 based on the display signal and the scan signal supplied via the data line and the scan line. The specific connection mode of the thin film transistors 9 and 10, the data line, the scan line, and the organic light emitting diode element 16 will be explained later.

The organic light emitting diode element 16 functions as a light emission element. Specifically, the organic light emitting diode element 16 has a structure having at least one of a hole transport layer and an electron transport layer, and an emitting layer, so as to emit light by radiative recombination of a hole and an electron injected into the emitting layer. The hole transport layer, the electron transport layer, and the emitting layer are made of organic materials such as diamine compounds, quinolinol aluminum complex, and phthalocyanine, and have a structure in which predetermined impurities are added according to need.

The protective layer 6 is for covering the organic light emitting diode element 16 from the outside air. When moisture, oxygen, and the like contained in air adhere to the organic light emitting diode element 16, carbon-carbon conjugated bond of the organic light emitting diode element 16 is separated, and therefore electrical conductivity of the organic light emitting diode element 16 is decreased. As a result, it is necessary to protect the organic light emitting diode element 16 from air containing moisture, oxygen, and the like, and hence the protective layer 6 is formed to cover the whole organic light emitting diode element 16.

The protective layer 6 is made of a material having excellent light transmission characteristics, in order to output light emitted from the organic light emitting diode element 16 to the outside. Specifically, the organic light emitting diode display according to the embodiment has a structure such that the organic light emitting diode element 16 functions as a light emission element, and emits light vertically upwards with respect to the array substrate 18. Therefore, the protective layer 6 located vertically upwards with respect to the organic light emitting diode element 16 needs to have excellent light transmission characteristics, in order to prevent the transmission of light emitted from the organic light emitting diode element 16 from being hindered. As a material having such characteristics, for example, $SiN_x$ is used. $SiN_x$ herein is not constituted only of Si atoms and N atoms, but may contain predetermined impurities, for example, impurities such as hydrogen, oxygen, and the like are mixed at a certain ratio.

The stress relaxation layer 7 is for relaxing the intensity of stress applied to the array substrate 18 by the protective layer 6. Specifically, the stress relaxation layer 7 is arranged to divide the area where the protective layer 6 is arranged into a plurality of areas. For the material constituting the stress relaxation layer 7, a photoresist is used in the embodiment. This is because the stress relaxation layer 7 having a desired pattern can be easily formed by using a photolithographic technique or the like. As described below, since the stress relaxation layer 7 is also used as a deposition mask at the time of manufacturing the organic light emitting diode display, the photoresist is used from a standpoint that it also serves as a mask. However, since the photoresist has poor light transmission characteristics, it is desired to arrange the photoresist at a position where the light emitted from the organic light emitting diode element 16 is not hindered. Further, a dielectric layer 24 formed at the time of forming the protective layer 6 exists on the stress relaxation layer 7. The stress relaxation layer 7 separates the dielectric layer 24 from the protective layer 6, so that adjacent protective layers 6 are not contacted to each other via the dielectric layer 24. Since the dielectric layer 24 does not have an important function in the embodiment, it is omitted in FIG. 1, and will be omitted in other figures appropriately for convenience sake of explanation. Since the dielectric layer 24 does not have a characteristic function in the organic light emitting diode display according to the embodiment, the dielectric layer 24 may be removed at the time of manufacturing.

Figure 3:
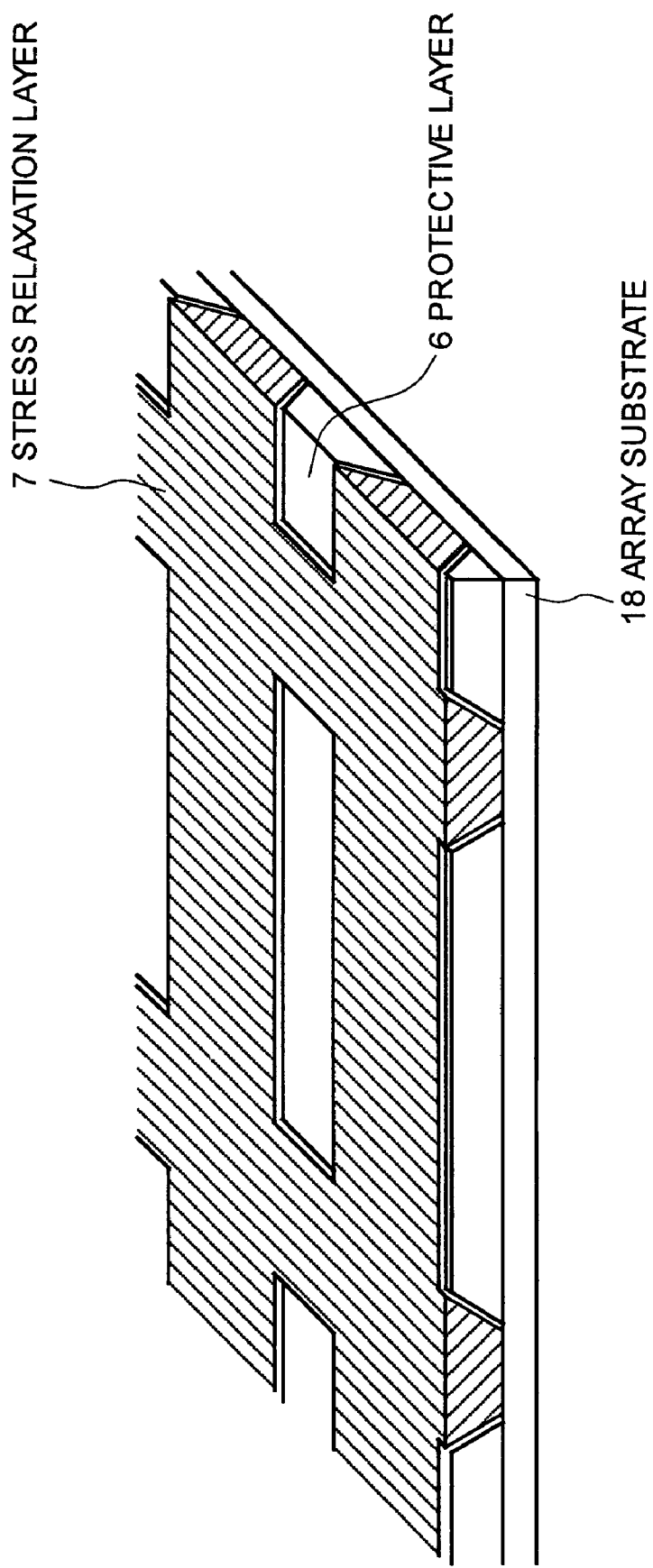
FIG. 3 is a schematic perspective view illustrating arrangement of a protective layer and a stress relaxation layer in the organic light emitting diode display device.

FIG. 3 is a schematic perspective view of the specific structure of the protective layer 6 and the stress relaxation layer 7 deposited on the surface of the array substrate. The sectional structure of the stress relaxation layer 7 has a trapezoidal shape, with the top width of the trapezoid larger than the base width. Such a structure can be realized, for example, by using a predetermined photoresist for a material forming the stress relaxation layer 7, and optimizing the heating temperature.

Figure 4:
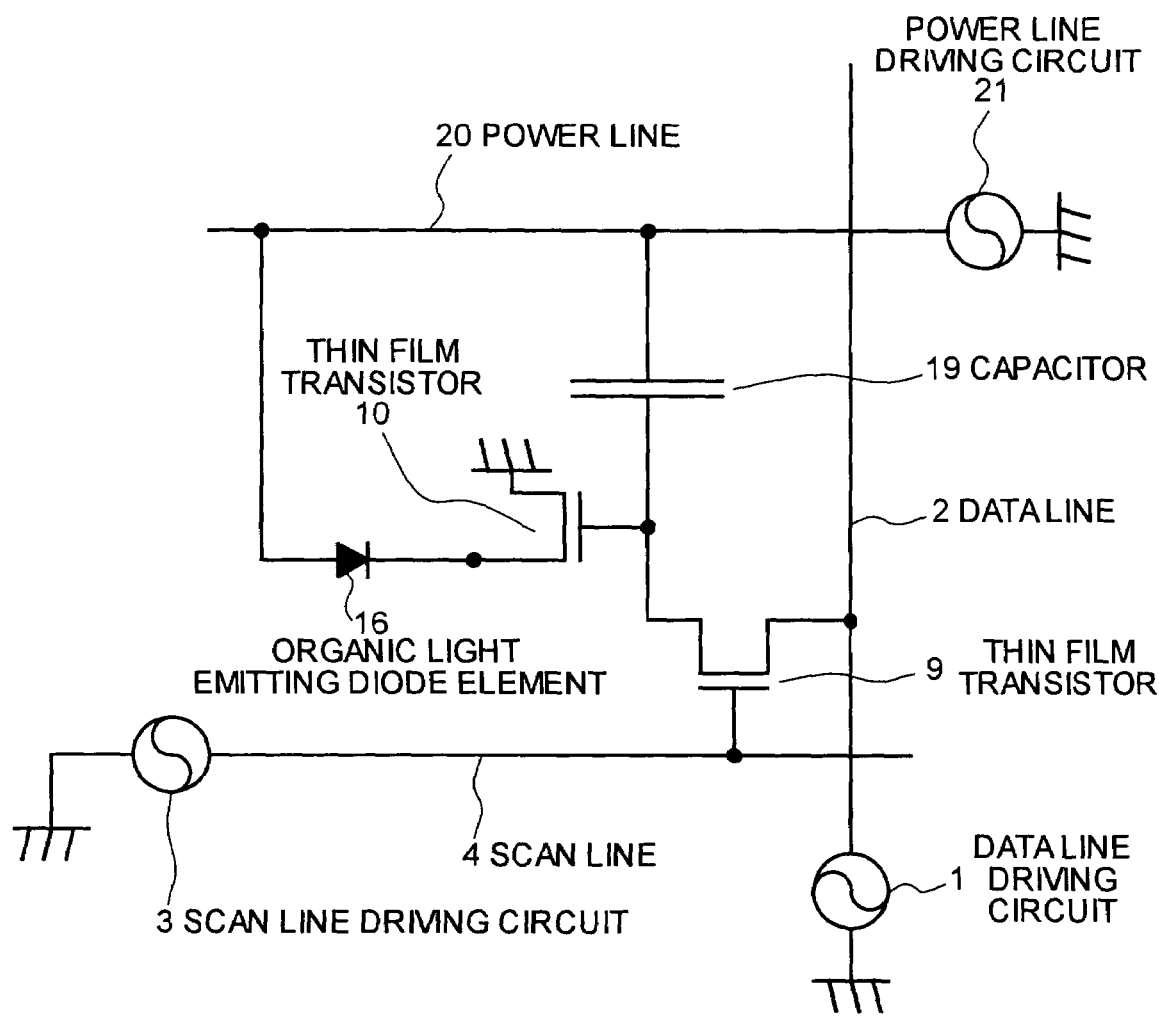
FIG. 4 is an equivalent circuit diagram of the display cell of the organic light emitting diode display device.

The circuit structure to be arranged in the display area 5 will now be explained. FIG. 4 is a diagram indicating an equivalent circuit in a part of a display cell of the organic light emitting diode display device. The organic light emitting diode element 16 and the thin film transistor 9 are connected to each other via one of the source and drain electrodes, and functions as a driver element, which controls the emitting state of the organic light emitting diode element 16. Further, the thin film transistor 10 is connected to the gate electrode of the thin film transistor 9 via the other of the source and drain electrodes, and functions as a switching element.

Further, the gate electrode of the thin film transistor 9 is connected to the scan line 4, and the other of the source and drain electrodes is connected to the data line 2. The organic light emitting diode element 16 is connected to the power line 20, and a capacitor 19 is arranged between the other of the source and drain electrodes of the thin film transistor 9 and the power line 20. By having such a circuit structure, a desired one of the plurality of organic light emitting diode elements 16 arranged on the array substrate 18 is selected, and the current flowing in the selected organic light emitting diode element 16 is controlled to control the emitting state of the organic light emitting diode element, being a light emission element that emits light by flowing electric current thereto.

An advantage obtained by providing the stress relaxation layer 7 will be explained. The protective layer 6 is arranged in a physically separated state on the area separated by the stress relaxation layer 7, not in an integrally deposited state on the surface of the array substrate. Therefore, the area in which the respective protective layers 6 separated by the stress relaxation layer 7 come in contact with the array substrate is smaller than the area when the stress relaxation layer 7 is not provided.

Figure 5A:
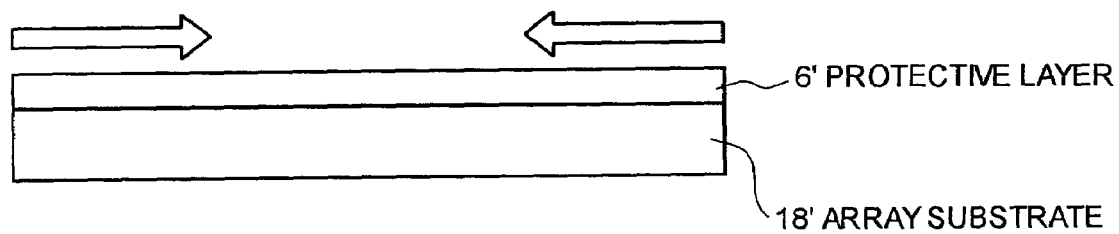
FIGS. 5A and 5B are diagrams for explaining a stress caused by the protective layer to the array substrate.
Figure 5B:
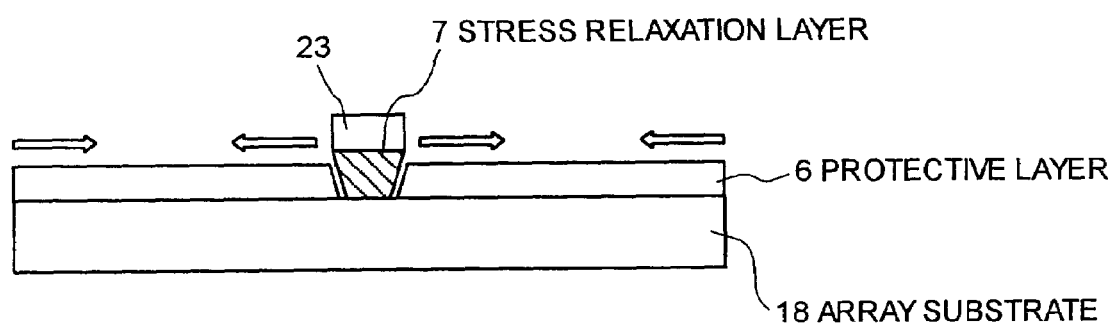

FIG. 5A is a diagram for explaining a stress generated in a structure in which the stress relaxation layer 7 is not provided, for a comparison, and FIG. 5B is a diagram for explaining changes in the stress by providing the stress relaxation layer 7. In the case of FIG. 5A, the protective layer 6' is integrally arranged on the array substrate 18', and hence the stress applied by the protective layer 6' is large as shown by the arrows in FIG. 5A.

On the other hand, in the organic light emitting diode display device, the protective layer 6 is arranged on the array substrate 18, with the protective layer 6 separated into a plurality of areas by the stress relaxation layer 7. Therefore, the area in which the individual protective layer 6 comes in contact with the array substrate 18 is small as compared with FIG. 5A, and it is obvious that the length of the stress in the application direction becomes short.

Generally, the stress changes according to the contact area and the length of stress in the application direction. Therefore, in the organic light emitting diode display according to the embodiment, the stress applied to the array substrate 18 becomes smaller than the case of FIG. 5A, and hence the influence of the stress with respect to the array substrate 18 is relaxed. As a result, there is an advantage in that even when the protective layer 6 is made of, for example, $SiN_x$ film-formed at a low temperature, peeling of the protective layer 6 and cracks in the array substrate 18, which occur in the conventional structure, can be suppressed. Further, by relaxing the stress due to the protective layer 6 by the stress relaxation layer 7, the protective layer 6 itself can be prevented from being damaged in the crystalline structure by the stress, to decrease the covering property against the outside air.

In the organic light emitting diode display device, also as shown in FIG. 1, the contact area with the array substrate 18 and the horizontal sectional shape of the individual protective layer 6 separated by the stress relaxation layer 7 are the same. Therefore, the stress applied by the individual protective layer 6 with respect to the array substrate 18 becomes equal, thereby having an advantage in that the stress does not concentrate in a specific area of the array substrate 18.

One example of the manufacturing method of the organic light emitting diode display device will be explained below. FIGS. 6A to 6C, and FIGS. 7A to 7C indicate the manufacturing method of the organic light emitting diode display according to the embodiment. The manufacturing method will be explained below with reference to these figures.

Figure 6A:
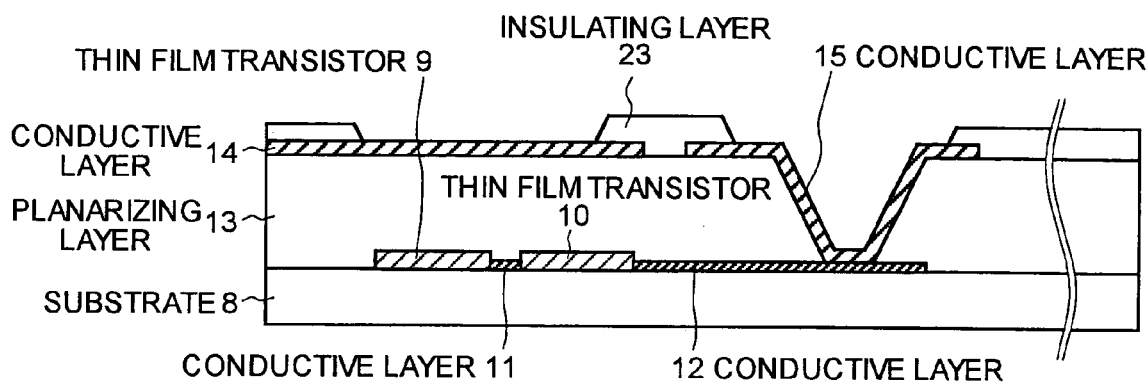
FIGS. 6A to 6C are sectional views indicating a manufacturing process of the organic light emitting diode display device.

At first, form the thin film transistors 9 and 10, the conductive layer 11 for connecting the thin film transistors 9 and 10, and the conductive layer 12 for connecting the thin film transistor 10 and the organic light emitting diode element 16 on the nonconductive substrate 8 according to a predetermined process. After having deposited the planarizing layer 13 on the substrate 8 by using an insulating material such as polymers, $SiN_x$, or the like, form a contact hole on a part of the area on the conductive layer 12. At the point in time of forming the planarizing layer 13, the organic light emitting diode element has not yet been formed. Therefore, even when the planarizing layer 13 is made of $SiN_x$ or the like, the planarizing layer 13 can be formed at a high temperature, and the formed planarizing layer 13 does not cause a stress problem. Then deposit conductive layers 14 and 15 having a predetermined pattern on the planarizing layer 13, and deposit thereon an insulating layer 23 that electrically separates the conductive layer 17 formed later from the conductive layer 14 and prevents the organic light emitting diode element 16 from being cut. As a result, the structure shown in FIG. 6A is formed.

Figure 6B:
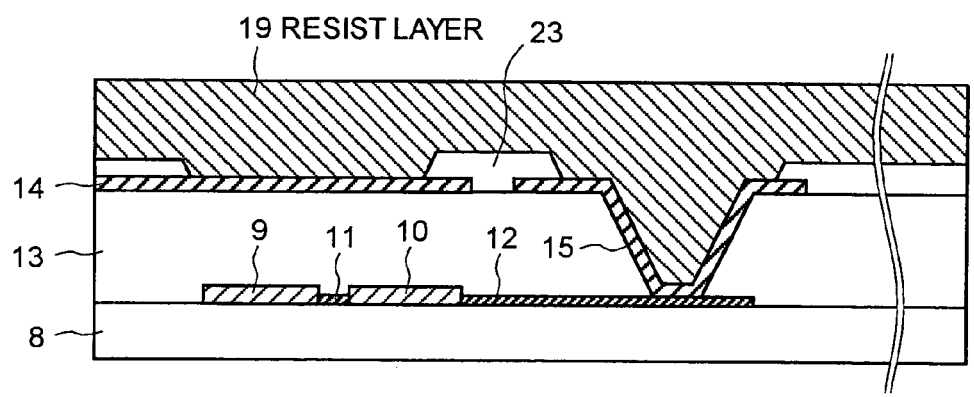
Figure 6C:
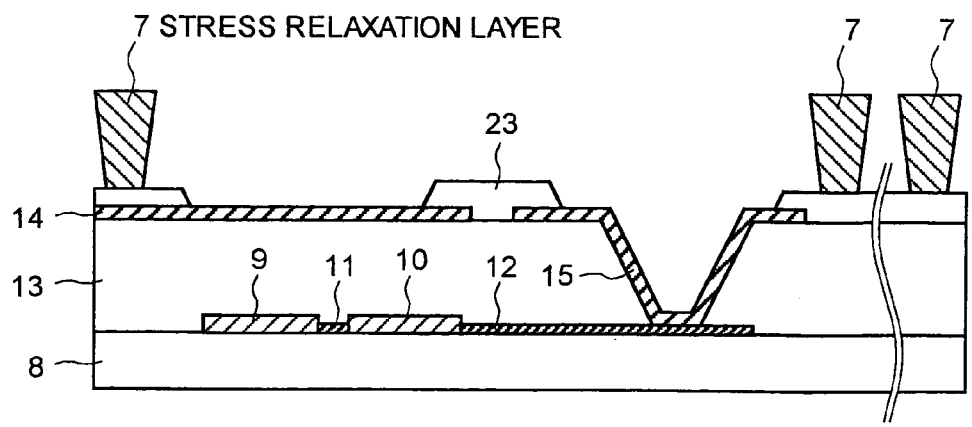

Thereafter, form the stress relaxation layer 7. As shown in FIG. 6B, apply a resist layer 19 on the whole surface by a spin coating method or the like. Form the stress relaxation layer 7 in an arrangement as shown in FIG. 6C by a photolithographic technique or the like. By adjusting the material for forming a resist layer 22, and the exposure time, the heating temperature, and the like at the time of forming the stress relaxation layer 7, the stress relaxation layer 7 having a structure in which the cross section is trapezoidal, and the top width of the trapezoid is longer than the base width can be obtained. Even at this time, since the organic light emitting diode element 16 has not yet been formed, the temperature at the time of forming the stress relaxation layer 7 is not particularly limited, and can be optionally optimized.

Figure 7A:
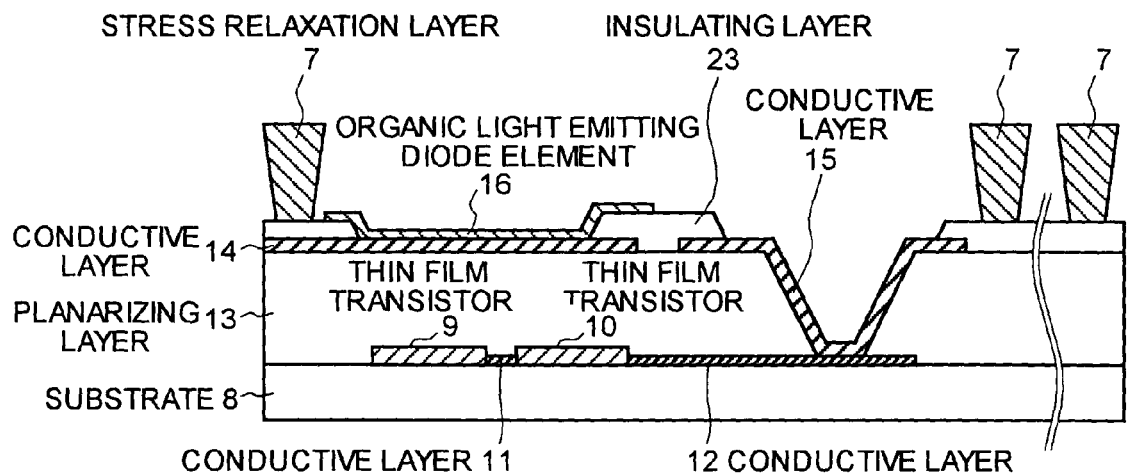
FIGS. 7A to 7C are sectional views indicating a manufacturing process of the organic light emitting diode display device.

As shown in FIG. 7A, vapor-deposit the organic light emitting diode element 16. In this process, in order to prevent transition of the material constituting the organic light emitting diode element 16 to the glass state, use a vapor deposition method capable of a low-temperature process to form the organic light emitting diode element 16 having an amorphous structure.

The stress relaxation layer 7 can be used as a deposition mask. Specifically, since the stress relaxation layer 7 has a so-called overhanging structure, when a film-forming technique such as vapor deposition is used, by which a material is deposited rectilinearly, a predetermined shadow mask can be used together, to form the organic light emitting diode element 16 in a self-aligned manner. The shadow mask is for forming the organic light emitting diode element 16 in a self-aligned manner, while preventing the material from being formed in an area other than the area to form the organic light emitting diode element 16.

Figure 7B:
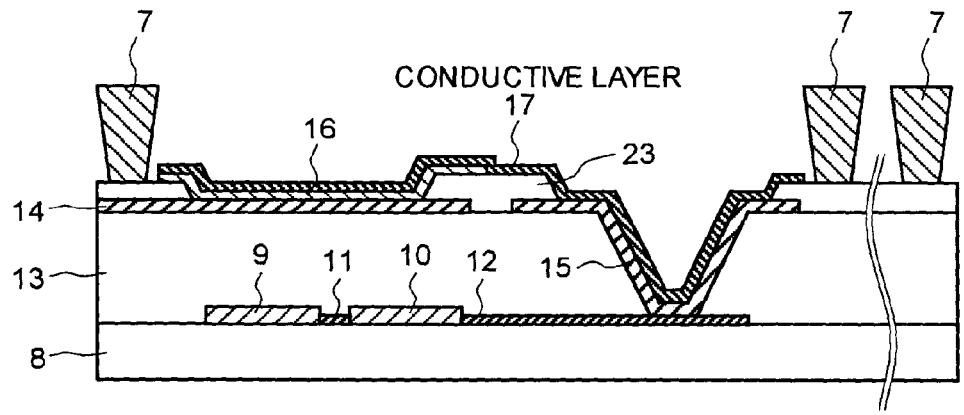

Thereafter, as shown in FIG. 7B, form a conductive layer 17 for picking up a cathode electrode from the organic light emitting diode element 16. Since the portion of the conductive layer 17 to be arranged on the organic light emitting diode element 16 needs to have light transmission characteristics, this portion is made of very thin MgAg, AlLi, or the like. From a standpoint of ensuring excellent electrical conductivity, a transparent conductive film such as Indium Tin Oxide (ITO) may be formed on the conductive layer 17. In this process, the stress relaxation layer 7 can be used as a mask, in the same manner when the organic light emitting diode element 16 is formed.

Figure 7C:
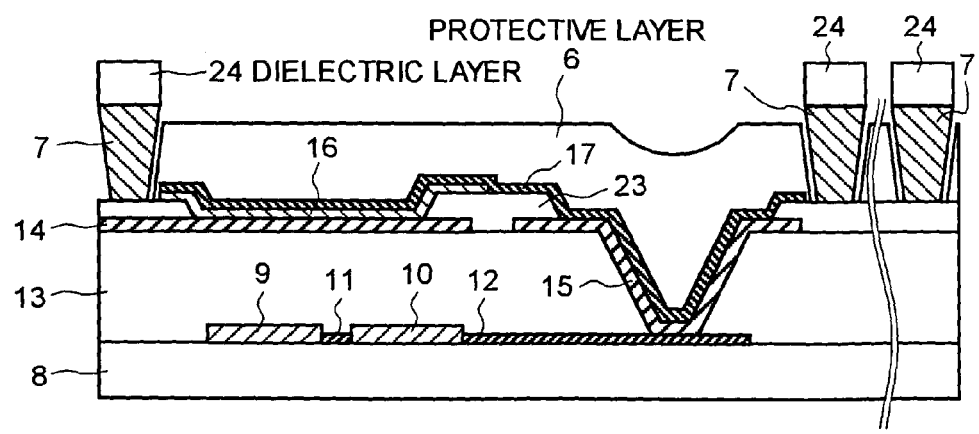

As shown in FIG. 7C, deposit the protective layer 6. Here, the protective layer 6 is formed by depositing $SiN_x$ or the like by using the chemical vapor deposition method (hereinafter, "CVD method") or the like, under a low temperature film-forming condition. In order to have a structure such that the protective layers 6 are completely separated from each other by the stress relaxation layer 7, it is desired to deposit the protective layer 6 so that it is thinner than the stress relaxation layer 7. If the protective layer 6 is thicker than the stress relaxation layer 7, there is the possibility that the adjacent protective layers are contacted to each other via a dielectric layer 24 deposited on the stress relaxation layer 7. Through the above process, the organic light emitting diode display device, as shown in FIG. 7, is manufactured.

As explained above, by providing the stress relaxation layer 7, the organic light emitting diode element 16 can be formed in a self-aligned manner. Particularly, since the stress relaxation layer 7 has a so-called overhanging structure, the organic light emitting diode elements 16 provided in a plurality of numbers on the display area can be separated completely from each other.

The stress relaxation layer 7 can be used as a mask pattern when the organic light emitting diode element 16 is vapor-deposited. Therefore, it is not necessary to form a mask pattern separately for the vapor deposition of the organic light emitting diode element 16, thereby simplifying the manufacturing process.

Since the stress relaxation layer 7 is formed in a previous process than the formation of the organic light emitting diode element 16, the temperature at the time of forming the stress relaxation layer 7 is not limited, and hence the stress relaxation layer 7 can be formed under the conditions similar to those of the conventional method. As a result, the stress relaxation layer 7 can be easily formed by using the conventional technique.

Further, the protective layer 6 is deposited by the CVD method or the like using a gas source. Therefore, the protective layer 6 is deposited so as to go around the stress relaxation layer 7, and hence the protective layer 6 can be arranged to cover the organic light emitting diode elements 16, thereby preventing the organic light emitting diode elements 16 from being affected by the outside air.

The present invention has been explained according to the embodiment, but the present invention is not limited to the embodiment, and those skilled in the art will be able to come up with various examples and modified examples. For example, the arrangement of the stress relaxation layer 7 is not necessarily be in a lattice form as shown in FIG. 1, and for example, the stress relaxation layer 7 may be formed such that the horizontal cross section of the individual protective layer 6 becomes triangle. Further, the arrangement of the stress relaxation layer 7 on the display area is limited to some extent by the arrangement of the organic light emitting diode element, but since there is no factor restricting the arrangement in the area other than the display area, the arrangement of the stress relaxation layer 7 may be different on the display area from the arrangement on the other areas. Even when such a structure is used, the stress relaxation layer 7 can be formed by using a mask pattern corresponding to the decided arrangement, and hence the load on the manufacturing process does not increase.

Further, the material for forming the protective layer 6 and the stress relaxation layer 7 may be other than $SiN_x$ and the photoresist described above, respectively. For example, a material obtained by mixing hydrogen or the like in $SiN_x$ in an amount of not larger than 35% by weight may be used for the protective layer 6. It is preferable to use such a material, since a function of blocking the outside air can be improved.

In the embodiment, the vertical cross section of the stress relaxation layer 7 is trapezoid. However, the stress due to the protective layer 6 can be relaxed even when the stress relaxation layer 7 has a cross section other than the trapezoid. The function as the stress relaxation layer is exerted by dividing the area where the protective layer 6 is arranged into a plurality of areas. Therefore, regardless of the vertical cross section thereof, the stress relaxation layer 7 can alleviate the influence of the stress due to the protective layer 6. However, there is a possibility that the adjacent protective layers 6 are contacted to each other through the surface of the stress relaxation layer 7, depending on the film thickness of the protective layer 6 and the film thickness of the stress relaxation layer 7. On the other hand, if the overhanging structure is employed, by increasing the top width of the stress relaxation layer 7, it can be suppressed that $SiN_x$ adheres on the sides of the stress relaxation layer 7, thereby suppressing the contact between the protective layers 6. Further, since the organic light emitting diode element 16 can be formed in a self-aligned manner, it is desired to employ the overhanging structure.

In the embodiment, the stress relaxation layer 7 may have a function as a shading unit. Generally in the organic light emitting diode display, a part of light emitted from the organic light emitting diode element 16 may be reflected by the conductive layers 14, 17, and the like, and such reflected light may cause cross-talk. Therefore, it is necessary to have a shading unit. On the other hand, by forming the stress relaxation layer 7 of a material having a shading property, the stress relaxation layer 7 can not only relax the stress due to the protective layer 6, but also serve as a shading unit. Since the stress relaxation layer 7 serves as the shading unit, a ¼ Lambda wave plate, which has been heretofore provided in order to suppress the reflected light, can be omitted.

The organic light emitting diode display device has a three-dimensional structure in which a circuit elements such as thin film transistors 9 and 10 are arranged on the lower layer, and the organic light emitting diode element 16, being the light emission element, is arranged on the upper layer, but the circuit elements and the organic light emitting diode element may be arranged on the same layer. Even in such a structure, it is necessary to form a layer structure for sealing the organic light emitting diode element from the outside air, after vapor deposition of the organic light emitting diode element. Since such a layer structure should be formed by a low temperature process in order to prevent the organic light emitting diode element from being damaged, as in the above structure, it is necessary to provide a unit that relaxes the stress applied by the layer structure, regardless of having the three-dimensional structure or not.

An organic light emitting diode display device having a data line, a scan line, and a switching element, a so-called active matrix structure, has been explained as the organic light emitting diode display device according to the embodiment. However, the scope of the present invention is not limited thereto, and the present invention is also applicable to organic light emitting diode displays having other structures. For example, the present invention is applicable to an organic light emitting diode display device using a passive matrix structure, so long as it has a structure in which the organic light emitting diode element is provided as the light emission element, and the organic light emitting diode element is sealed from the outside air by a protective layer.

As explained above, according to the present invention, since the stress relaxation layer is provided to divide the area where the protective layer is provided into a plurality of areas, a stress caused by the protective layer can be relaxed or suppressed. As a result, an organic light emitting diode display device that can prevent a damage of the substrate, and peeling and damage of the protective layer can be realized.

According to the present invention, since a photoresist is used as the stress relaxation layer, the stress relaxation layer can be easily formed by using a conventional method, and the stress can be relaxed or suppressed without increasing a load on the manufacturing process.

According to the present invention, since the vertical cross section of the stress relaxation layer is trapezoid, with the top width larger than the base width, even when the protective layer is deposited on the stress relaxation layer, it can be suppressed that the adjacent protective layers, with the stress relaxation layer put therebetween, are contacted via the surface of the stress relaxation layer, thereby suppressing an increase in the stress caused by the protective layer.

According to the present invention, since the upper face of the stress relaxation layer has a lattice structure, and the organic light emitting diode elements are located between the lattice, the stress relaxation layer is not arranged on the organic light emitting diode elements, and the protective layer covers the organic light emitting diode elements from the outside air, and suppresses a deterioration in the characteristics of the organic light emitting diode elements.

According to the present invention, since the stress relaxation layer is used as a deposition mask at the time of vapor deposition of the organic light emitting diode element, a deposition mask is not required separately, thereby realizing an organic light emitting diode display device that can be manufactured easily without complicating the manufacturing process.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

This application claims priority from Japanese Patent Application 2002-258138, filed Sep. 3, 2002, which is incorporated herein by reference in its entirety.

What is claimed is:

1. An organic light emitting diode display device comprising:
   a substrate;
   a driver formed on the substrate;
   a planarizing layer covering the driver, having a contact hole;
   a conductive pattern formed on the planarizing layer and an inner surface of the contact hole, electrically connected to the driver;
   an organic light emitting diode element electrically connected to the conductive pattern, controlled by the driver and having an upper surface from which light is emitted;
   a protective layer comprising a material transmitting the light from the organic light emitting diode element, and covering the upper surface of the organic light emitting diode element and the conductive pattern formed in the contact hole; and a stress relaxation layer which is made of a shading material and adjacent to sides of the protective layer, for relaxing a stress caused by the protective layer, the protective layer being divided by the stress relaxation layer.

2. The organic light emitting diode display device according to claim 1, wherein the stress relaxation layer surrounds the protective layer.

3. The organic light emitting diode display device according to claim 1, wherein there is a space between the sides of the protective layer and the stress relaxation layer.

4. The organic light emitting diode display device according to claim 1, wherein the stress relaxation layer is made of a material different from that of the protective layer.

5. The organic light emitting diode display device according to claim 1, wherein both the planarizing layer and the protective layer comprise SiN.

6. The organic light emitting diode display device according to claim 1 wherein the protective layer is made of an inorganic material, and the stress relaxation layer is made of an organic material.

7. The organic light emitting diode display device according to claim 1, wherein the protective layer is made of a silicon nitride, and the stress relaxation layer is made of a photoresist.

8. The organic light emitting diode display device according to claim 1, wherein a top face of the stress relaxation layer is above the protective layer.

9. The organic light emitting diode display device according to claim 1, wherein a vertical cross section of the stress relaxation layer is a trapezoid with a top wider than a base.

10. The organic light emitting diode display device according to claim 1, wherein the stress relaxation layer is thicker than the protective layer.

11. A method of manufacturing an organic light emitting diode display device, comprising:

forming on a substrate a thin film transistors for driving an organic light emitting diode element;

forming a planarizing layer having a contact hole, for covering the thin film transistors;

forming a conductive pattern on the planarizing layer and an inner surface of the contact hole, electrically connected to the thin film transistor;

forming a stress relaxation layer which is made of a shading material and surrounds area where a protective layer is formed, for relaxing a stress caused by the protective layer;

forming the organic light emitting diode element on a part of the area; and forming the protective layer on the area to cover the organic light emitting diode element and the conductive pattern formed on the inner surface of the contact hole, wherein the protective layer is divided by the stress relaxation layer.

12. The method of manufacturing the organic light emitting diode display device according to claim 11, wherein the stress relaxation layer is thicker than the protective layer.

13. The method of manufacturing an organic light emitting diode display device according to claim 11, wherein both the planarizing layer and the protective layer compose SiN.

14. An organic light emitting diode display device comprising:

a substrate;

a driver on the substrate;

a planarizing layer having a contact hole, for covering the driver;

an organic light emitting diode element electrically connected to the conductive pattern, controlled by the driver; and having an upper surface from which light is emitted;

a protective layer comprising a material transmitting the light from the organic light emitting diode element, and covering the upper surface of the organic light emitting diode element and the conductive pattern formed on the inner surface of the contact hole;

a wall which is made of a shading material and adjacent to the protective layer; and a layer on the wall, separated from the protective layer.

15. The organic light emitting diode display device according to claim 14, wherein the layer on the wall is made of dielectric material.

16. The organic light emitting diode display device according to claim 14, wherein the wall is thicker than the protective layer.

17. The organic light emitting diode display device according to claim 14, wherein there is a space between the protective layer and the wall.

18. The organic light emitting diode display device according to claim 14, wherein both the planarizing layer and the protective layer comprise SiN.

* * * * *